(12) United States Patent
Zenner et al.

(10) Patent No.: US 8,384,218 B2
(45) Date of Patent: Feb. 26, 2013

(54) BACK SIDE METALLIZATION WITH SUPERIOR ADHESION IN HIGH-PERFORMANCE SEMICONDUCTOR DEVICES

(75) Inventors: Soeren Zenner, Dresden (DE); Gotthard Jungnickel, Radeberg (DE); Frank Kuechenmeister, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 113 days.

(21) Appl. No.: 12/886,812

(22) Filed: Sep. 21, 2010

(65) Prior Publication Data
US 2011/0074031 A1 Mar. 31, 2011

(30) Foreign Application Priority Data

Sep. 30, 2009 (DE) .................. 10 2009 043 740

(51) Int. Cl.
*H01L 23/48* (2006.01)
*H01L 23/52* (2006.01)
*H01L 29/40* (2006.01)
(52) U.S. Cl. ............... 257/751; 257/753; 257/E21.584
(58) Field of Classification Search .............. 257/751, 257/753, E21.584
See application file for complete search history.

(56) References Cited

U.S. PATENT DOCUMENTS

| 5,554,866 | A | * | 9/1996 | Nishioka et al. | 257/295 |
| 5,561,326 | A | | 10/1996 | Ito et al. | 257/751 |
| 5,670,422 | A | * | 9/1997 | Tabara | 438/644 |
| 2007/0141800 | A1 | * | 6/2007 | Kurihara et al. | 438/396 |
| 2008/0203571 | A1 | | 8/2008 | Jungnickel et al. | 257/751 |

OTHER PUBLICATIONS

Translation of Official Communication from German Patent Office for German Patent Application No. 10 2009 043 740.1-43 dated Jun. 1, 2010.

* cited by examiner

*Primary Examiner* — Jarrett Stark
(74) *Attorney, Agent, or Firm* — Williams, Morgan & Amerson, P.C.

(57) ABSTRACT

In sophisticated semiconductor devices, the metal-containing layer stack at the back side of the substrate may be provided so as to obtain superior adhesion to the semiconductor material in order to reduce the probability of creating leakage paths in a bump structure upon separating the substrate into individual semiconductor chips. For this purpose, in some illustrative embodiments, an adhesion layer including a metal and at least one non-metal species may be used, such as titanium oxide, in combination with further metal-containing materials, such as titanium, vanadium and gold.

23 Claims, 3 Drawing Sheets

BACK SIDE METALLIZATION WITH SUPERIOR ADHESION IN HIGH-PERFORMANCE SEMICONDUCTOR DEVICES

BACKGROUND OF THE INVENTION

1. Field of the Invention

The present disclosure generally relates to the field of fabricating integrated circuits, and, more particularly, to enhancing heat dissipation in semiconductor devices by providing a back side metallization.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are continuously decreased with the introduction of every new circuit generation to provide currently available integrated circuits formed by volume production techniques with critical dimensions of 50 nm or less and having an improved degree of performance in terms of speed and/or power consumption. A reduction in size of transistors is an important aspect in steadily improving device performance of complex integrated circuits, such as CPUs (central processing units), GPUs (graphical processing units) and the like. The reduction in size is commonly associated with an increased switching speed, thereby enhancing signal processing performance at transistor level. Due to the decreased dimensions of the active circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

As the number of circuit elements, such as transistors and the like, per unit area increases in the device level of sophisticated semiconductor devices, the number of electrical connections associated with the circuit elements in the device level also has to be increased, typically even in an over-proportional manner, thereby requiring complex interconnect structures which may be provided in the form of metallization systems including a plurality of stacked metallization layers. In these metallization layers, metal lines providing the inner level electrical connections and vias providing intra level connections are formed on the basis of very conductive metals, such as aluminum, copper and the like, in combination with appropriate dielectric materials to reduce the parasitic RC (resistance capacitance) time constants. Generally, in semiconductor devices requiring a complex contact regime for connecting the metallization system with the device periphery, i.e., with a package substrate and the like, frequently, a bump structure is provided as the very last layer of the metallization system in which contact bumps, such as solder bumps or any other type of metal elements, such as pillars and the like, are provided in the passivation material of the semiconductor chip in order to act as contact areas for connecting to complementary contact elements of a package substrate and the like. For instance, solder material may be provided on at least one of the contact elements of the semiconductor chip and the substrate package, which may be subsequently re-flowed after mechanically contacting these two components. In this manner, an electrical and mechanical contact may be established between the semiconductor chip and the carrier substrate with high electrical performance due to a reduced contact resistance and a reduced parasitic capacitance. In this contact technology, the entire available chip area may be used for positioning individual bumps or metal elements without being restricted to the periphery chip area, as may be the case in well-established wire bonding techniques. Due to the increasing complexity of sophisticated semiconductor devices, typically, the input/output (I/O) capabilities and thus the number of bumps or metal elements in the bump structure also has to be increased, wherein, however, the requirement for an increased packing density in the device level and in the metallization system may also result in an increased packing density of metal elements in the bump structure. For example, in semiconductor devices including circuit elements including critical dimensions of 30 nm and less, a typical pitch between neighboring bumps may be approximately 180 µm with the prospect of pitches of 165-130 µm in further advanced device generations.

As previously explained, the high packing density typically in the device level, i.e., in the semiconductor material of the semiconductor device, typically results in an increased power consumption, as, for instance, the static and dynamic power consumption of very sophisticated transistor elements may increase, for instance due to a reduced thickness of gate dielectrics and the like, while, in other cases, in addition to the increased power consumption of individual transistors, the increased packing density may finally result in an increased power consumption per unit area, which in turn leads to the generation of an increased amount of waste heat. One path of dissipating heat from the semiconductor level to the periphery is heat conductivity via the metallization system and the bump structure into the substrate carrier, which in turn may be coupled to any appropriate heat sink arrangement. Due to the increased number of metallization levels in the metallization system of very complex semiconductor devices and due to the fact that increasingly dielectric materials of reduced dielectric constant are used in the metallization systems, the thermal resistance of the metallization system including the bump structure may no longer be compatible with the heat dissipation capabilities required in sophisticated applications. For this reason, frequently, the substrate back side of semiconductor devices may also be used as an efficient heat dissipation path, which may be connected to the periphery, for instance a package and the like, by an appropriate thermal interfacial material that thermally connects the substrate back side to the package substrate. For example, indium is frequently used as a thermal interfacial material due to its superior heat conductivity. In other cases, gallium, silver, copper and the like may also be efficiently used as a thermal interfacial material. Due to the material characteristics, such as diffusion behavior, adhesion with specific materials such as silicon and the like, the thermal interfacial material may typically not be directly formed on the substrate back side, such as a silicon surface, but may require additional material layers in order to obtain the desired thermal, mechanical or chemical behavior of the coupling between the substrate back side and a package. For this purpose, an adhesion layer is formed on the surface of the substrate in order to provide adhesion of the following materials to the semiconductor material of the substrate. For instance, aluminum, aluminum alloys, titanium, titanium nitride, tantalum, tantalum nitride, tantalum silicide are materials frequently used as an adhesion material. Thereafter, a barrier material, such as titanium, tantalum, tantalum nitride, tantalum silicide, nickel, chromium and the like, is provided in order to prevent the diffusion of indium, i.e., of the thermal interfacial material, into the material of the substrate, such as silicon and the like. In addition to these material layers, one or more layers are also provided to act as an adhesion layer appropriately attaching the thermal interfacial material to the back side metallization stack and thus to the semiconductor substrate. For this purpose, materials consisting of gold, gold alloys, platinum, gold/platinum alloys, copper, silver and the like may be used. Consequently, a moderately complex metallization layer stack is to be formed on the back side of the semiconductor substrate, in which a plurality of different materials have to be deposited, at least some of which may typically have a negative effect on the semiconductor devices and process techniques so that, in view of the prevention of any cross-contamination, the back side metallization layer stack is typically provided in a very advanced manufacturing stage, i.e., the back side metallization layer stack is formed at one of the last process steps in a semiconductor facility. It turns out, however, that the back side metallization stack may result in significant yield loss during the further processing of the semiconductor devices, in particular when a reduced pitch of a bump structure is required, as will be explained with reference to FIG. 1.

Figure 1:
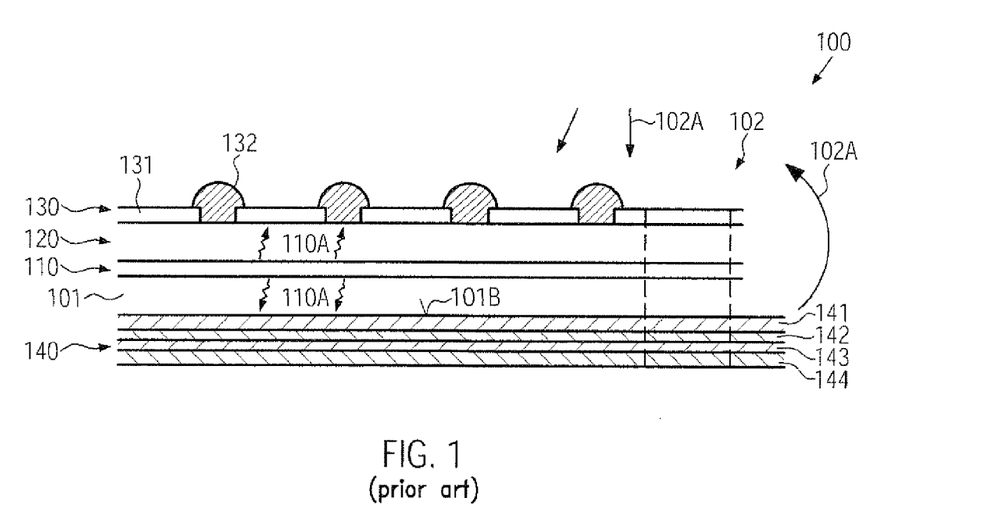
FIG. 1 schematically illustrates a cross-sectional view of a conventional semiconductor device in which a back side metal layer stack is provided in order to enhance the heat dissipation capability of the semiconductor device on the basis of a thermal interfacial material, wherein, however, the metal layer stack may result in significant contamination of a bump structure during the separation of the substrate into individual semiconductor chips.

FIG. 1 schematically illustrates a cross-sectional view of a semiconductor device 100 which comprises a substrate 101, such as a silicon substrate, a silicon-on-insulator (SOI) substrate and the like. As previously discussed, the substrate 101 may act as a carrier for forming therein and thereon circuit elements, such as field effect transistors, capacitors, resistors and the like, as are required for providing a complex integrated circuit. For example, the substrate 101 comprises a semiconductor layer 110, which may also be referred to as a device level, in and above which are provided a plurality of circuit elements (not shown) which may generate a significant amount of heat, as indicated by 110A. As discussed above, the packing density and the configuration of individual circuit elements may have a significant influence on the heat generation in the device level 110. For example, in sophisticated applications, transistor elements, such as field effect transistors, having a short channel in combination with a very thin gate dielectric material may exhibit an increased static power consumption, for instance due to leakage currents through a very thin gate dielectric material. Moreover, in digital circuits, the operating frequency is typically selected at several hundred MHz up to several GHz, thereby also contributing to significant dynamic losses in the form of high transient currents so that a very efficient heat dissipation is required in order to meet the specifications of sophisticated semiconductor devices. Moreover, the device 100 comprises a metallization system 120, which is to be understood as a plurality of individual metallization layers (not shown) that provide the network of electrical connections between the individual circuit elements in the device level 110. It should be appreciated that circuit elements may also be provided in the metallization system 120 and in the substrate 101 below the device level 110, for instance in the form of capacitors and the like, depending on the overall complexity and configuration of the device 100. For convenience, any such circuit elements are not shown in FIG. 1.

Furthermore, a bump structure 130 is provided on and above the metallization system 120 and represents a plurality of bumps 132, at least many of which are electrically connected to the metallization system 120, thereby providing the I/O capabilities of the device 100 for communication with the periphery, for instance in the form of a package substrate and the like. The bump structure 130 may comprise any appropriate dielectric material 131 for passivating the device 100, while the bumps 132, which may also be provided in the form of metal pillars and the like, are comprised of any appropriate metal material, such as solder material and the like. As previously explained, a pitch between neighboring bumps 132 may be 180 µm for sophisticated semiconductor devices and may have to be significantly reduced in even more complex semiconductor devices.

Moreover, at a back side 101B of the substrate 101, a metallization layer stack 140 is formed in order to allow the attachment of an appropriate thermal interfacial material, such as indium, in a later manufacturing stage. The layer stack 140 comprises an adhesion layer 141, such as an aluminum layer or a layer comprised of one of the materials mentioned above, with an appropriate thickness of, for instance, approximately 100 nm. The adhesion layer 141 is to provide desired high adhesion of the subsequent materials of the layer stack 140 and of the indium material to be provided in a further advanced manufacturing stage. Furthermore, a barrier layer 142, such as a titanium layer, having a thickness of approximately 100 nm is formed on the adhesion layer 141. Furthermore, a further metal-containing material, for instance in the form of nickel vanadium (NiV) 143, is formed on the barrier material 142 with any appropriate thickness, such as approximately 350 nm. Finally, the layer stack 140 comprises a further metal layer 144, such as a gold layer, which may be considered as an adhesion layer for ensuring a desired high degree of adhesion with respect to the thermal interfacial material, such as indium, to be formed on the layer 144 at a later stage. The layer 144 may be provided with a thickness of approximately 100 nm.

The semiconductor device 100 as illustrated in FIG. 1 may be formed on the basis of the following processes. The semiconductor layer 110 may be appropriately processed in order to form circuit elements therein and thereabove, for instance by providing isolation structures (not shown) to divide the semiconductor layer 110 into appropriate semiconductor regions. Thereafter, the circuit elements in the form of transistors, resistors, capacitors and the like are formed in and above the semiconductor regions and above isolation structures, depending on the overall configuration of the device 100. As indicated above, in sophisticated devices, critical dimensions in the device level 110 may be 50 nm and significantly less. Thereafter, the circuit elements are embedded in a dielectric material (not shown), in which appropriate contact elements are provided to connect the circuit elements with the metallization system 120. Next, the metallization system 120 may be formed by providing a plurality of metallization layers, each of which may include an appropriate dielectric material in combination with metal features, such as metal lines and vias, in accordance with the circuit layout of the device 100. Finally, the bump structure 130 is formed by depositing the dielectric material 131 and patterning the same in order to form appropriate openings for receiving the bumps 132. The bumps 132 may be formed by providing any appropriate "underbump metallization system" (not shown) and depositing any appropriate conductive material, for instance by electrochemical deposition techniques, and finally removing any non-desired excess material.

During the entire process flow, well-established process techniques are used wherein the back side 101B of the substrate 101 may be exposed to various process environments, for instance by handling the device 100, which may typically be accomplished by contacting the substrate 101 at an edge region and/or on the back side 101B, by positioning the substrate 101 on substrate holders of process tools by exposing at least a portion of the back side 101B to the deposition atmosphere of many deposition processes and the like. Consequently, the back side 101B may at least be partially modified with respect to its chemical and mechanical characteristics during the entire process flow for forming the semiconductor device 100 as shown in FIG. 1. Furthermore, in a very advanced manufacturing stage, for instance after forming the bump structure 130, the back side metallization stack 140 is formed in order to avoid the contamination of other device areas of the device 100 and/or the contamination of process tools and the like. For example, a plurality of metal species may result in significant modification of device characteristics when diffusing into sensitive device areas. During the formation of the layer stack 140, typically, the device 100 is positioned in an appropriate process tool for establishing a sputter deposition ambient in order to form the aluminum layer 141 on the back side 101B. For this purpose, any appropriate process chamber, for instance of a cluster tool and the like, may be used in combination with an appropriate target material provided therein by establishing appropriate deposition conditions, such as plasma power for ionizing a carrier gas and to sputter off target atoms from the target material by directing ionized particles to the sputter material. The atoms and/or ions that are released from the target material upon the particle bombardment may then deposit on the surface 101B. Thereafter, the device 100 is positioned in a further sputter deposition chamber in which the titanium material of the layer 142 is deposited on the layer 141. Similarly, the material layer 143 may be provided by sputter deposition in a further sputter deposition chamber having an appropriate target material provided therein. Finally, the gold layer 144 may be formed by sputter deposition in a further sputter deposition chamber on the basis of appropriate process parameters. Consequently, in the example shown in FIG. 1, four sputter deposition tools or process chambers are used for providing the metallization stack 140. During the further processing of the device 100, the substrate 101 is to be separated into individual semiconductor chips, which is accomplished by appropriately dicing the substrate 101, as indicated by 102. During the process 102, the materials of the back side layer stack 140 are also separated, which may result in additional metal-containing contaminating particles 102A, which may also deposit on the bump structure 130. Consequently, these contaminants 102A stemming from the layer stack 140 may cause leakage paths in the bump structure 130 and may even result in a shorting of neighboring bumps 132. Consequently, significant yield loss may be generated in a very advanced manufacturing stage due to the presence of the back side metallization layer stack 140. Furthermore, as previously discussed, upon further reducing the pitch between adjacent bumps 132, the probability of causing yield loss in the bump structure 130 may even further increase. On the other hand, the layer stack 140 may be required for enabling the provision of a thermal interfacial material to be formed on the stack 140 so as to thermally couple the device level 110 to a package substrate when the heat dissipation via the metallization system 120 is not sufficient for meeting the thermal specifications of the device 100. Due to the increased probability of creating contamination during the patterning of the stack 140 during the process 102, it has also been proposed to remove the material of the stack 140 within scribe lanes of the device 100, thereby substantially avoiding the release of any contaminating particles, such as the particles 102A during the process 102. For this purpose, however, additional complex patterning strategies, such as lithography and etch processes, are required in a very advanced manufacturing stage thereby significantly contributing to increased production costs for sophisticated semiconductor devices.

In view of the situation described above, the present disclosure relates to semiconductor devices and manufacturing techniques in which a back side metallization layer stack may be provided while avoiding or at least reducing one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and manufacturing techniques in which a layer stack may be formed on the back side of a substrate of a semiconductor device so as to provide the required heat dissipation capability while significantly reducing the probability of creating contaminations and without requiring additional patterning processes. For this purpose, the overall adhesion of the layer stack at the back side may be increased by using an appropriate material system, thereby efficiently reducing the probability of creating contaminating particles during the separation of the substrate of the semiconductor device into individual chips. Furthermore, in some illustrative aspects disclosed herein, the overall efficiency in depositing the material system at the back side may be increased by reducing the number of required deposition chambers in that two different material layers may be formed in the same deposition environment.

One illustrative semiconductor device disclosed herein comprises a substrate having a front side and a back side. Moreover, a metallization system is formed above the front side. Additionally, a metal-containing layer stack is formed on the back side and comprises an adhesion layer formed on the back side and a metal layer formed on the adhesion layer. The adhesion layer represents a compound comprising a metal species and at least one non-metal species.

A further illustrative semiconductor device disclosed herein comprises a substrate having a first surface and a second surface opposite to the first surface with a metallization system formed above the first surface. The semiconductor device further comprises an adhesion layer formed on the second surface, wherein the adhesion layer comprises at least one of titanium, tantalum, tungsten, rhenium, oxygen and nitrogen. Additionally, the semiconductor device comprises a metal layer formed on the adhesion layer, wherein the metal layer comprises at least one of titanium, tantalum, tungsten, rhenium, copper and chromium.

One illustrative method disclosed herein relates to forming a semiconductor device. The method comprises forming an adhesion layer on a back side of a substrate of the semiconductor device by performing a sputter deposition process in a first deposition environment. The method further comprises forming a first metal layer on the adhesion layer by performing a second sputter deposition process in the first deposition environment. Additionally, the method comprises forming at least one further metal layer on the first metal layer in at least one further deposition environment that differs from the first deposition environment.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques in which superior adhesion of a material system to be formed on the back side of a substrate of a semiconductor device may result in a significantly reduced degree of contamination upon separating the substrate into individual semiconductor chips. The material system may also provide required heat dissipation capabilities and interface characteristics for efficiently connecting the substrate with a thermal interfacial material, such as indium, copper and the like, in order to provide the desired diffusion blocking capabilities in combination with mechanical and chemical characteristics. Due to the superior adhesion of the material system, an additional patterning of the material system prior to actually separating the substrate into individual chips may not be required, thereby contributing to superior overall production costs since corresponding complex patterning processes may be avoided while at the same time production yield is maintained at a desired high level. In some illustrative embodiments disclosed herein, at least two of the different material layers may be formed within the same deposition environment, i.e., within the same process chamber, thereby further contributing to reduced production costs, since overall throughput may be increased, for instance, by avoiding additional transport activities while also reducing the required process resources.

In some illustrative embodiments, the superior adhesion may be accomplished by providing a metal-containing adhesion layer in which at least one non-metal species may be incorporated so that the overall adhesion of the layer stack to the back side of the substrate, such as a silicon surface, may be enhanced, wherein a thickness of the adhesion layer may be appropriately selected to obtain the desired heat conductivity. In one illustrative embodiment, the adhesion layer may be formed on the basis of titanium oxide, which may have a superior adhesion to silicon material or other semiconductor-based materials, wherein a thickness may be selected in a range of approximately 1-50 nm. In a further illustrative embodiment, a metal layer may be formed on the titanium oxide-based adhesion layer and may be comprised of titanium, which may thus enable the deposition of the titanium material in the same process chamber used for depositing the titanium oxide material. Consequently, superior throughput at reduced required tool resources may be achieved on the basis of this strategy. In other illustrative embodiments, other material systems may be used for the adhesion layer and the subsequent metal layer, wherein, in many of these embodiments, material compositions may also be used in which the deposition in one process chamber may be accomplished. In other cases, other appropriate material systems may be provided to obtain the desired superior adhesion in combination with the heat conductivity capabilities, as will be described later on in more detail.

It should be appreciated that, in the present application, any designation with respect to the position of components and material layers has to be understood as designations or information referring to an appropriate reference plane. For this purpose, typically, the front side of a substrate of a semiconductor device may be referred to and any component or material layer formed on or above the front side to be understood as a component or layer that is positioned directly on the front side or offset therefrom according to a direction pointing away from the interior of the substrate. Similarly, it may be referred to a back side of the substrate and any components or material layers formed on and above the back side are to be understood as components and material layers formed directly on the back side or positioned offset therefrom according to a direction pointing away from the interior of the substrate. Consequently, positional information such as "above" and the like may refer to two opposite directions when referring to components positioned above the front side and the back side of the substrate, respectively.

With reference to FIGS. 2a-2d, further illustrative embodiments will now be described in more detail, wherein reference may also be made to FIG. 1, if appropriate.

Figure 2A:
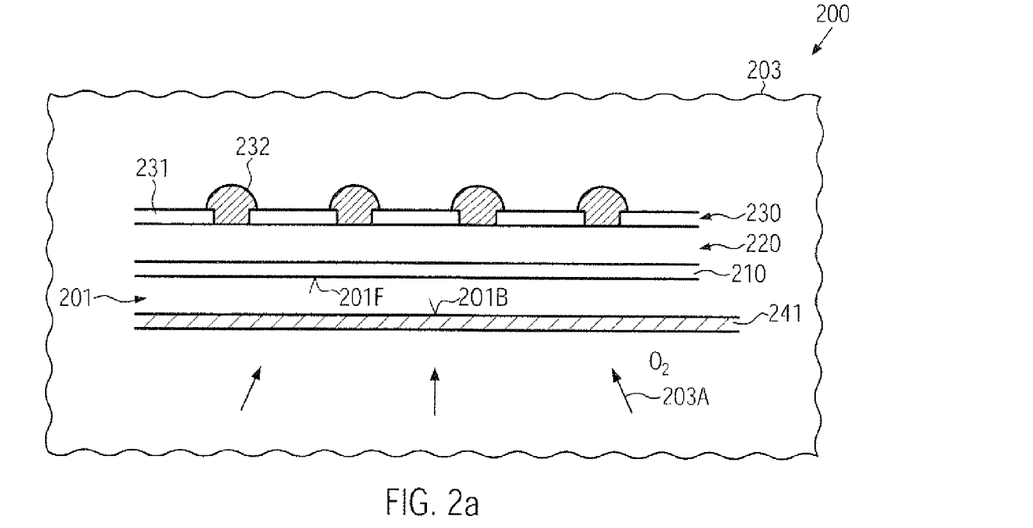
FIGS. 2a-2d schematically illustrate cross-sectional views of a semiconductor device during various manufacturing stages when forming a metal-containing layer stack on the back side of a semiconductor substrate with superior adhesion in order to reduce the probability of releasing contaminating particles upon separating the semiconductor substrate into individual semiconductor chips, according to illustrative embodiments.

FIG. 2a schematically illustrates a cross-sectional view of a semiconductor device 200 in an advanced manufacturing stage. As illustrated, the device 200 may comprise a substrate 201, such as a semiconductor material, such as silicon, silicon/germanium, germanium and the like, insulating material and the like. The substrate 201 may comprise a front side 201F on and above which circuit elements may be provided, as is also previously explained. For example, a semiconductor layer 210, possibly in combination with any intermediate isolation structures and the like, may be formed on the front side 201F and may have any appropriate composition, for instance, in the form of a silicon material, a germanium material, a silicon/germanium material, or any other appropriate semiconductor compound in order to achieve the desired electronic characteristics of the layer 210. Hereinafter, the layer 210 may also be referred to as a device level since in and above the semiconductor material 210 most of the semiconductor-based circuit components, such as transistors and the like, may be provided. It should be appreciated, however, that circuit elements may also be formed within a portion of the substrate 201, if required. Furthermore, an insulating material such as a buried insulating layer (not shown) may be provided below the semiconductor layer 210, if required. It should be noted that a thickness of the substrate 201 and of the semiconductor layer 210 and of any other further material layers is not drawn to scale in order to enhance the readability of the drawings. For example, typically, a thickness of the substrate 201 may be significantly greater compared to a thickness of the semiconductor layer 210 in sophisticated semiconductor devices. Furthermore, for convenience, any circuit elements, such as field effect transistors and the like, are not shown, wherein, however, it should be appreciated that, in some illustrative embodiments, critical device dimensions of any such circuit elements, such as a gate length and the like, may be approximately 50 nm and significantly less. Moreover, a metallization system 220, which may include any appropriate number of individual metallization layers (not shown) may be provided above the device level 210 in order to establish the required electrical connections for any circuit elements formed in the device level 210. For example, in sophisticated semiconductor devices, the metallization system 220 may comprise low-k dielectric materials, i.e., materials having a dielectric constant of 3.0 and less, in combination with highly conductive metals, such as copper, copper alloys, silver, aluminum and the like. For instance, in complex CPUs, the metallization system 220 may comprise five or more stacked metallization layers, the configuration of which may thus have a significant influence on the overall heat dissipation capabilities of the semiconductor device 200.

Furthermore, a bump structure 230 may be provided as a final level of the semiconductor device 200 in order to provide electrical contact to the metallization system 220 and to provide contact areas for connecting to a peripheral component, such as a carrier substrate, also referred to as a package and the like. For this purpose, the bump structure 230 may comprise any appropriate dielectric material or materials 231 and metal elements 232, for instance in the form of "bumps," metal pillars and the like. Typically, the metal elements or bumps 232 may be comprised of one or more materials so as to enable a direct contact to a contact pad or a further metal element of a carrier substrate which may have a complementary contact regime compared to the bump structure 230.

The device 200 may comprise an adhesion layer 241 formed "on" the back side 201B of the substrate 201. The adhesion layer 241 may provide a superior adhesion to the material of the substrate 201 which may have experienced various modifications during the process sequence for forming the device 200 as illustrated in FIG. 2a. In some illustrative embodiments, the adhesion layer 241 may be provided in the form of a metal-containing compound, wherein at least one additional non-metal species may be included in order to obtain the superior adhesion characteristics. In this respect, the presence of at least one non-metal species is to be understood such that a fraction of a non-metal species may be higher compared to typical impurity levels of material layers provided in a semiconductor facility. That is, in the present application, the adhesion layer 241, which in some illustrative embodiments comprises a non-metal species, is to be understood as a material composition in which both the metal species and the non-metal species are provided with at least five atomic percent with respect to entire composition of the layer 241. For example, if an oxygen species is incorporated in the layer 241, at least a fraction of five atomic percent of the entire atoms of a unit volume of the layer 241 is represented by oxygen atoms. Similarly, if two or more non-metal species are incorporated in the layer 241, the two or more non-metal species may contribute with five or more percent to the total number of atoms within a representative unit volume of the layer 241. In some illustrative embodiments, the metal-containing adhesion layer 241 may comprise tantalum, tungsten, titanium, rhenium, chromium, in combination with one or more non-metal species, such as oxygen, nitrogen and the like. For example, the layer 241 may be comprised of tantalum oxide ($TaO_2$), a tantalum, nitrogen and oxygen compound ($Ta(N_xO_y)$, wherein x and y may meet the requirements specified above, tungsten oxide, a tungsten, nitrogen and oxygen compound, titanium tungsten in combination with nitrogen and oxygen, rhenium in combination with nitrogen and oxygen, chromium oxide, tungsten in combination with nitrogen and oxygen and the like. For example, for these materials, a thickness of the layer 241 may be selected in a range of approximately 5-500 nm, wherein the term "approximately" may refer to any process-related thickness fluctuations, depending on the process technique used.

In one illustrative embodiment, the adhesion layer 241 may be provided in the form of a titanium oxide ($TiO_2$) material with a thickness in the range of approximately 1-50 nm, for instance, approximately 25 nm. It should be appreciated that the stoichiometric formula $TiO_2$ may be used for convenience, wherein the actual fraction of oxygen may vary depending on the deposition conditions, however, within the above-specified range.

The semiconductor device 200 as shown in FIG. 2a may be formed on the basis of the following process strategy. Any circuit elements in and above the device level 210 may be formed by using sophisticated process techniques, such as lithography, etch techniques, implantation processes, planarization processes and the like, as required to obtain the circuit elements having dimensions in accordance with the overall design rules. After embedding the circuit elements into a dielectric material, the metallization system 220 may be formed on the basis of any appropriate process strategy, such as the formation of a dielectric material, the patterning thereof and the subsequent filling in of metal-containing materials. Furthermore, as previously indicated, an appropriate contact regime may be formed to act as an interface between the device level 210 and the metallization system 220. Thereafter, the bump structure 230 may be formed by any appropriate process technique, as is also previously described with reference to the device 100. It should be appreciated that, at any appropriate manufacturing stage, the adhesion layer 241 may be formed to provide superior compatibility with the processes for forming other components of the device 200. For instance, in some illustrative embodiments, the adhesion layer 241 may be formed in a very advanced manufacturing stage, for instance after providing the bump structure 230, while in other cases the layer 241 may be formed during the formation of the metallization system 220, for instance when similar materials may be used during forming the various metallization layers. For this purpose, the device 200 may be positioned in a deposition environment 203, which is to be understood as a process tool or a process chamber of a process tool, which may comprise several process chambers in which appropriate process conditions may be established to deposit material of the layer 241, preferably on the back side 201B. In one illustrative embodiment, the deposition environment 203 may represent the process chamber of a sputter deposition tool in which an appropriate plasma may be generated to obtain, on the basis of an appropriate target material, a metal species to be incorporated in the layer 241. Moreover, if an additional non-metal species is to be incorporated into the layer 241, an appropriate precursor material 203A may be supplied to the ambient established in the process environment 203. For example, oxygen, nitrogen and the like may be supplied as gases to the environment 203 on the basis of appropriately selected flow rates to obtain, in combination with corresponding plasma conditions, the material composition of the layer 241. For example, in a sputter tool deposition chamber which are typically available in any semiconductor facility, a plasma power of approximately 2-15 KW may be applied in order to process substrates of a diameter of 200-300 mm in order to release a metal species from a target material, such as a titanium target, a tantalum target, a tungsten target and the like. If a single metal material such as a rhenium layer is to be provided as the adhesion layer 241, a flow rate of a carrier gas such as argon of approximately 5-50 SCCM (standard cubic centimeter per minute) may be appropriate for process chambers for processing substrates of dimensions as specified before. In other illustrative embodiments in which a non-metal species may be incorporated, a flow rate in the range of 10-100 SCCM may be applied, wherein a flow rate of 0-50 SCCM of a carrier gas, such as argon, may be supplied to the environment 203. For example, the precursor gas may be provided in the form of oxygen and/or nitrogen. For instance, in one illustrative embodiment, a plasma power of approximately 5 kW with an argon flow rate of approximately 15 SCCM and an oxygen flow rate of approximately 40 SCCM may be used in order to form an oxide-based material, such as a titanium oxide, a tantalum oxide and the like. It should be appreciated, however, that the above-specified parameter ranges may have to be adapted on the basis of the available deposition tools, since the chamber geometry and configuration may have a significant influence on these process parameters.

In some illustrative embodiments, prior to initiating the actual material deposition in the environment 203, the back side 201B may be efficiently processed by creating a particle bombardment in order to efficiently "sputter off" undesired contaminants from the back side 201B. As previously explained, corresponding contaminations and material residues may have been formed on the back side 201B during the preceding manufacturing sequence.

In other illustrative embodiments, the substrate 201 may be reduced in thickness, for instance by etching and/or polishing, in order to enhance the overall thermal characteristics of the device 200. In this case, after a material removal process, the adhesion layer 241 may be efficiently applied, possibly in combination with a preceding sputter cleaning process, as described above. For instance, the layer 241 may be applied on the back side 201B of a substrate having a thickness of approximately 50 μm.

Figure 2B:
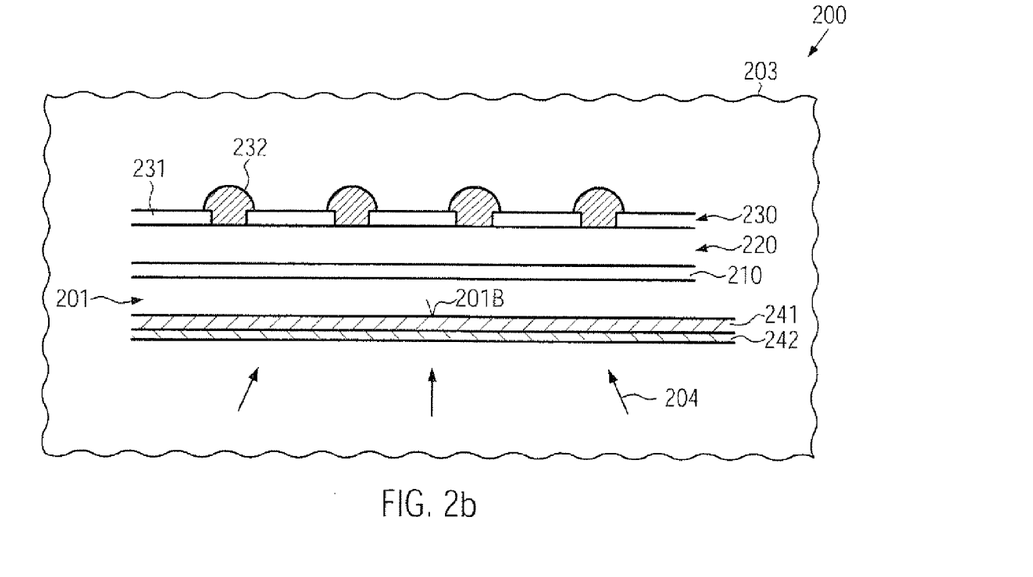

FIG. 2b schematically illustrates the semiconductor device 200 in a further advanced stage in which the device 200 in one illustrative embodiment may be maintained within the deposition environment 203 so as to form a metal layer 242 on the adhesion layer 241 during a deposition process 204. In this case, the metal layer 242 may be formed on the basis of a metal species, which may be available in the environment 203 in the form of a sputter target material, thereby avoiding any additional transport activities, which may thus contribute to an increased overall throughput. In some illustrative embodiments, the deposition process 204 may be performed on the basis of the same metal species that may also be incorporated in the adhesion layer 241. In this case, the deposition process 204 may be performed by discontinuing the supply of any non-metal species, such as oxygen, nitrogen and the like, thereby forming the metal layer 242 having a superior adhesion to the adhesion layer 241. It should be appreciated that any transition layer (not shown) may also be formed, for instance, by continuously reducing the supply of the non-metal species, such as the species 203A of FIG. 2a, and/or by a step-wise reduction of the supply of the species and/or by introducing an additional non-metal species and the like. In some illustrative embodiments, the metal layer 242 may comprise tantalum, tungsten, an alloy of titanium and tungsten, rhenium, chromium and an alloy of chromium and copper. The layer 242 may be provided with a thickness in the range of approximately 5-500 nm, depending on the overall configuration of a layer stack to be formed on the basis of the layers 241 and 242. In a further illustrative embodiment, the metal layer 242 may be provided in the form of a titanium layer having a thickness of approximately 60-150 nm, for instance, in one example, approximately 100 nm. In many embodiments, the thickness of the metal layer 242 may be greater than the thickness of the adhesion layer 241, thereby contributing to a superior heat conductivity for a given total thickness of the layers 241 and 242.

Figure 2C:
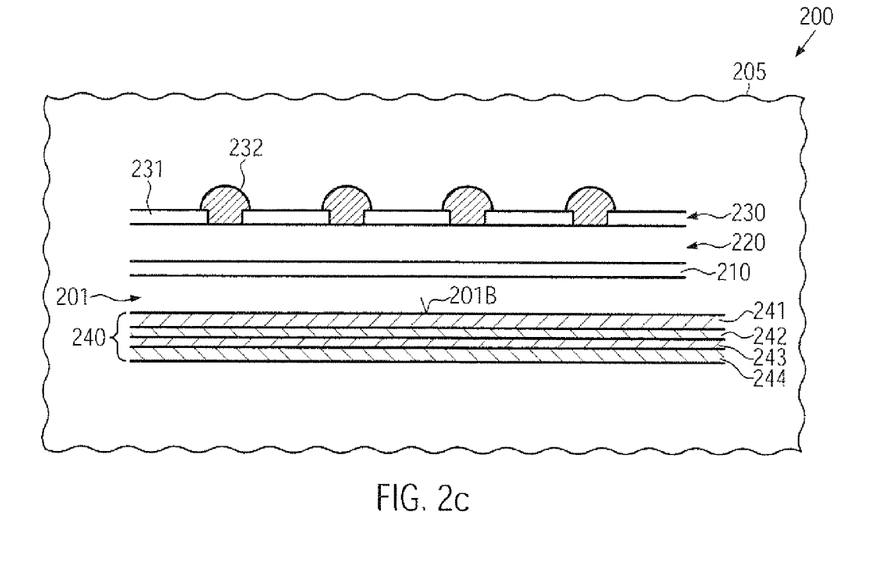

FIG. 2c schematically illustrates the semiconductor device 200 in a further advanced manufacturing stage. As shown, a metal-containing layer stack 240 is formed on the back side 201B and comprising the adhesion layer 241 and the metal layer 242 and at least one further metal layer, such as layers 243, 244. In one illustrative embodiment, the additional metal layer 243 may be comprised of a nickel-containing material, such as substantially pure nickel, a nickel vanadium (NiV) compound, a nickel silicide (NiSi), a nickel tungsten (NiW) compound, with a thickness in the range of approximately 50-2500 nm, depending on the overall requirements with respect to heat dissipation and the like. In one illustrative embodiment, the additional metal layer 243 may be comprised of a nickel vanadium compound, while the adhesion layer 241 may be comprised of titanium oxide and the metal layer 242 may be comprised of titanium. In this case, a thickness of approximately 250-500 nm, for instance approximately 350 nm, may be selected, thereby obtaining superior adhesion, a required heat dissipation performance and maintaining high process throughput. In other illustrative embodiments, the layers 241 and 242 in the form of a titanium oxide material and a titanium material, respectively, may be combined with a metal layer 243 in the form of nickel, nickel vanadium, nickel silicide, nickel tungsten with any appropriate thickness of approximately 50-2500 nm. In still other illustrative embodiments, the metal layer 243 may be comprised of nickel vanadium, while the metal layer 242 may be comprised of tantalum, tungsten, titanium tungsten, rhenium, chromium, chromium copper and the like. In this case, as previously discussed, in some embodiments, the adhesion layer 241 may be comprised of rhenium, rhenium in combination with a non-metal species, tantalum in combination with a non-metal species, tungsten in combination with a non-metal species, titanium tungsten in combination with a non-metal species, tungsten in combination with a non-metal species or chromium in combination with a non-metal species. The metal layer 243 may be formed on the basis of any appropriate sputter deposition process technique in which typically a specific deposition environment 205 may be established that is different from the environment 203 (FIG. 2b), since typically different metal species may have to be provided. Furthermore, a further metal layer 244 may be provided in some illustrative embodiments in order to provide superior adhesion characteristics in view of a thermal interfacial material, such as indium and the like, to be provided in a later manufacturing stage. For this purpose, appropriate metals, such as gold and the like, may be provided with an appropriate thickness. In one illustrative embodiment, a thickness of approximately 60-140 nm, for instance of approximately 100 nm, may be selected when using gold as material for the layer 244. In other cases, a thickness of approximately 25-500 nm may be used for materials such as gold, copper, platinum, palladium, a gold platinum alloy, a gold palladium alloy, a copper platinum alloy, a copper palladium alloy and the like. In this case, also the material and the thickness of the layer 243 may be appropriately adapted, for instance by using nickel, nickel vanadium, nickel silicide, nickel tungsten with a thickness up to approximately 2500 nm, as explained above. The metal layer 244 may be formed in a separate deposition environment when different materials are to be provided compared to the metal layer 243.

Consequently, the metal-containing layer stack 240 may comprise the adhesion layer 241, for instance in the form of a rhenium material or in the form of a material comprising a metal in combination with at least one non-metal species, thereby providing superior adhesion to the back side 201B. Additionally, appropriate barrier and adhesion characteristics may be obtained on the basis of the metal layers 242, 243 and 244, while at the same time providing a high thermal conductivity. It should be appreciated that the layers 242, 243 and 244 may be provided at any appropriate manufacturing stage, for instance in order to avoid undue cross-contamination of substrates and process tools. The adhesion layer 241 may be provided prior to one of the layers 242, 243 and 244 if contamination may be less critical, thereby providing superior integrity of the back side 201B. In other cases, the layer stack 240 may be provided during a process sequence without any intermediate process steps, wherein, as discussed above, in some illustrative embodiments, the number of required process chambers or deposition environments may be less than the number of layers in the layer stack 240.

Figure 2D:
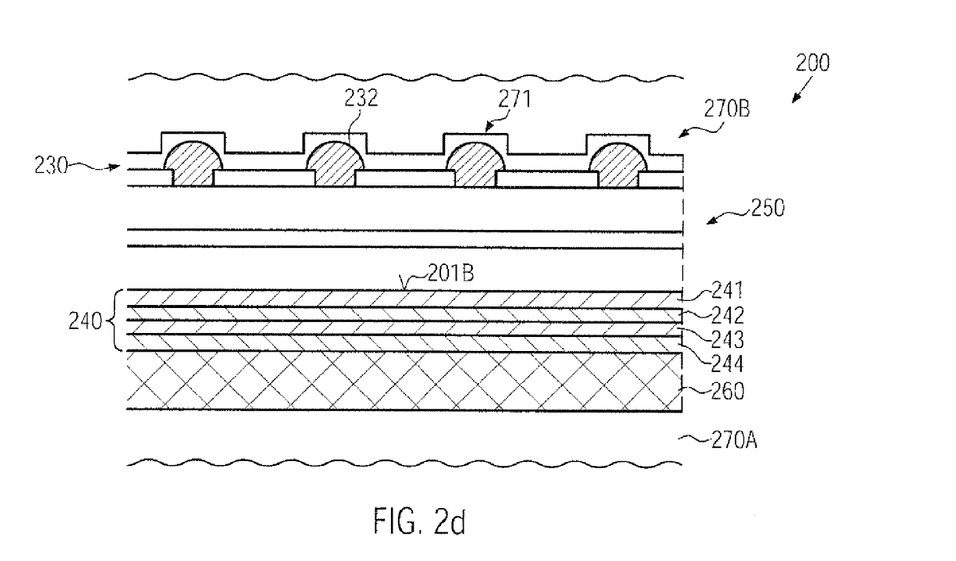

FIG. 2d schematically illustrates the semiconductor device 200 in a further advanced manufacturing stage in which individual chips 250 may be provided from the substrate 201 as shown in FIG. 2c. For this purpose, any appropriate separation process may be performed, as previously described with reference to FIG. 1. During the corresponding separation of the individual chips 250, the layer stack 240 may be patterned, however, with a significantly reduced probability of creating leakage current paths or short circuits in the bump structure 230 due to the superior adhesion of the stack 240 to the back side 201B. Furthermore, in the manufacturing stage shown, a package substrate 270B may be in contact with the bump structure 230, which may be accomplished on the basis of well-established contact techniques in which the bumps 232 may be brought into contact with a complementary contact structure 271 of the substrate 270B. Similarly, a carrier or package substrate 270A may be positioned above the back side 201B, for instance in the form of a lid of a package and the like, wherein a superior thermal coupling of the back side 201B and thus of the device level 210 with the substrate 270A may be accomplished via a thermal interfacial material 260, as is previously discussed. For example, the material 260 may be provided in the form of indium, copper, gallium and the like, wherein the layer stack 240 provides superior adhesion and thermal conductivity between the back side 201B and the material 260, which in turn provides efficient heat conduction into the substrate 270A. Consequently, by providing the adhesion layer 241 in accordance with any of the embodiments described above, a superior degree of flexibility in selecting additional metal materials may be accomplished, thereby enhancing adhesion of the individual layers of the stack 240 and adhesion to the thermal interfacial material 260, thereby obtaining superior overall heat dissipation capabilities of the chip 250.

As a result, the present disclosure provides semiconductor devices and manufacturing techniques in which a reduced degree of metal contamination may be induced in the bump structure of the semiconductor device upon separating the substrate into individual chips due to the superior adhesion of a back side layer stack, while at the same time superior heat dissipation capabilities may be provided. Furthermore, in some illustrative embodiments, the number of deposition chambers in a process sequence for forming the material layer stack may be reduced, thereby enhancing overall throughput, while required resources for the deposition sequence may also be reduced compared to conventional strategies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
    a semiconductor substrate having a front side and a back side, wherein at least said back side is comprised of a semiconductor material;
    a metallization system formed above said front side, said metallization system providing an electrical connection to at least one circuit element in a device level positioned between said metallization system and said front side; and
    a metal-containing layer stack formed on said back side, said metal-containing layer stack comprising:
        an adhesion layer formed directly on said back side semiconductor material;
        a transition layer formed on said adhesion layer, said adhesion layer and said transition layer comprising a compound that comprises a metal species and at least one non-metal species, wherein said at least one non-metal species comprises oxygen; and
        a metal layer formed on said transition layer, wherein a material concentration of said at least one non-metal species comprising said transition layer is reduced from a first concentration adjacent to said adhesion layer to a second concentration adjacent to said metal layer, said second concentration being less than said first concentration.

2. The semiconductor device of claim 1, wherein said at least one non-metal species further comprises nitrogen.

3. The semiconductor device of claim 1, wherein said metal layer is comprised of said metal species included in said adhesion layer.

4. The semiconductor device of claim 3, wherein said metal layer comprises titanium.

5. The semiconductor device of claim 4, wherein said compound represents a titanium oxide material.

6. The semiconductor device of claim 1, wherein said metal layer comprises at least one of titanium, tantalum, tungsten, rhenium and chromium.

7. The semiconductor device of claim 1, wherein a thickness of said adhesion layer is less than a thickness of said metal layer.

8. The semiconductor device of claim 7, wherein said thickness of said adhesion layer is in the range of approximately 1-50 nm.

9. The semiconductor device of claim 1, wherein said metal-containing layer stack further comprises a nickel-containing layer formed on said metal layer.

10. The semiconductor device of claim 9, wherein said nickel-containing layer comprises at least one of vanadium, silicon and tungsten so as to form a nickel compound.

11. The semiconductor device of claim 9, wherein said metal-containing layer stack further comprises a second metal layer formed on said nickel-containing layer.

12. The semiconductor device of claim 11, wherein said second metal layer comprises at least one of gold, copper, platinum and palladium.

13. The semiconductor device of claim 11, wherein said metal-containing layer stack comprises a titanium oxide layer formed directly on said back side semiconductor material, a titanium layer formed on said titanium oxide layer, said nickel-containing layer formed on said titanium layer and said second metal layer.

14. The semiconductor device of claim 1, wherein said transition layer comprises at least two non-metal species.

15. The semiconductor device of claim 1, wherein said first concentration of said at least one non-metal species is at least approximately 5 atomic percent.

16. The semiconductor device of claim 1, wherein said material concentration of said at least one non-metal species is substantially continuously reduced from said first concentration to said second concentration.

17. The semiconductor device of claim 1, wherein said material concentration of said at least one non-metal species is substantially step-wise reduced from said first concentration to said second concentration.

18. A semiconductor device, comprising:
a semiconductor substrate having a first surface and a second surface opposite to said first surface;
a metallization system formed above said first surface, said metallization system providing an electrical connection to at least one circuit element in a device level positioned between said metallization system and said first surface;
an adhesion layer formed directly on a semiconductor material at said second surface;
a transition layer that is formed on said adhesion layer, said adhesion layer and said transition layer comprising at least one non-metallic species and at least one of titanium, tantalum, tungsten, and rhenium, said at least one non-metallic species comprising at least one of oxygen and nitrogen; and
a metal layer formed on said transition layer, said metal layer comprising at least one of titanium, tantalum, tungsten, rhenium, copper and chromium, wherein a material concentration of said at least one non-metallic species comprising said transition layer is reduced from a first concentration adjacent to said adhesion layer to a second concentration adjacent to said metal layer, said second concentration being less than said first concentration.

19. The semiconductor device of claim 18, further comprising a heat dissipation material formed above said metal layer.

20. The semiconductor device of claim 19, wherein said heat dissipation material comprises indium.

21. The semiconductor device of claim 20, further comprising a second metal layer formed on said metal layer.

22. The semiconductor device of claim 21, wherein said second metal layer comprises nickel.

23. The semiconductor device of claim 21, further comprising a third metal layer formed on said second metal layer, wherein said third metal layer comprises at least one of gold, copper, platinum and palladium.

* * * * *